US009219493B1

(12) United States Patent
Kunnen et al.

(10) Patent No.: US 9,219,493 B1
(45) Date of Patent: Dec. 22, 2015

(54) ANALOG-TO-DIGITAL CONVERTER WITH EXPECTED VALUE NONLINEARITY CALIBRATION

(71) Applicant: FREESCALE SEMICONDUCTOR, INC., Austin, TX (US)

(72) Inventors: George R. Kunnen, Tempe, AZ (US); Mark A. Lancaster, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/550,525

(22) Filed: Nov. 21, 2014

(51) Int. Cl.
*H03M 1/10* (2006.01)
*H03M 3/00* (2006.01)

(52) U.S. Cl.
CPC ............... *H03M 3/388* (2013.01); *H03M 3/32* (2013.01); *H03M 3/458* (2013.01); *H03M 3/496* (2013.01)

(58) Field of Classification Search
CPC ....... H03M 3/458; H03M 3/496; H03M 3/32; H03M 1/12; H03M 3/388; H03M 3/358
USPC .......................................... 341/118–120, 155
See application file for complete search history.

(56) References Cited

U.S. PATENT DOCUMENTS

| | | | | |
|---|---|---|---|---|
| 5,594,612 | A * | 1/1997 | Henrion | H03M 1/1038 324/620 |
| 5,638,071 | A * | 6/1997 | Capofreddi | H03M 1/1047 341/118 |
| 7,085,663 | B1 * | 8/2006 | Tsyrganovich | H03M 3/388 341/120 |
| 7,187,310 | B2 * | 3/2007 | El-Sankary | H03M 1/1004 341/118 |
| 7,196,645 | B2 * | 3/2007 | Bock | H03M 1/1004 341/120 |
| 7,602,323 | B2 | 10/2009 | Galton et al. | |
| 8,542,138 | B2 | 9/2013 | Galton et al. | |
| 2008/0150773 | A1 * | 6/2008 | Arais | H03M 3/388 341/120 |
| 2012/0194369 | A1 | 8/2012 | Galton et al. | |

OTHER PUBLICATIONS

Gerry Taylor et al., "A Mostly-Digital Variable-Rate Continuous-Time Delta-Sigma Modulator ADC," IEEE Journal of Solid-State Circuits, vol. 45, No. 12, pp. 2634-2646, Dec. 2010.
Gerry Taylor et al., "A Reconfigurable Mostly-Digital ΔΣ ADC with a Worst-Case FOM of 160dB," Symposium on VLSI Circuits Digest of Technical Papers (VLSIC) 2012, pp. 166-167, 2012.

* cited by examiner

*Primary Examiner* — Jean B Jeanglaude
(74) *Attorney, Agent, or Firm* — Charlene R. Jacobsen

(57) ABSTRACT

A system includes an analog-to-digital converter (ADC) for converting an analog input signal to a digital signal output and a nonlinearity corrector for correcting nonlinear error in the digital signal output to produce a corrected digital signal output. A source of the nonlinear error is associated with the ADC, wherein an analog calibration signal is introduced to the source of the nonlinear error during conversion of the analog calibration signal to a digital calibration output having the nonlinear error. After conversion of the analog calibration signal to the digital calibration output, a calibration circuit calculates expected values of correlation sums in response to the digital calibration output and determines correction coefficients using the expected values of the correlation sums. The calibration circuit provides correction data based upon the correction coefficients to the nonlinearity corrector.

20 Claims, 7 Drawing Sheets

- ◌ CONTRIBUTES TO "A*" AVERAGE
- ◯ CONTRIBUTES TO "B*" AVERAGE
- ○ CONTRIBUTES TO "C*" AVERAGE
- ◌ CONTRIBUTES TO "D*" AVERAGE

166

168

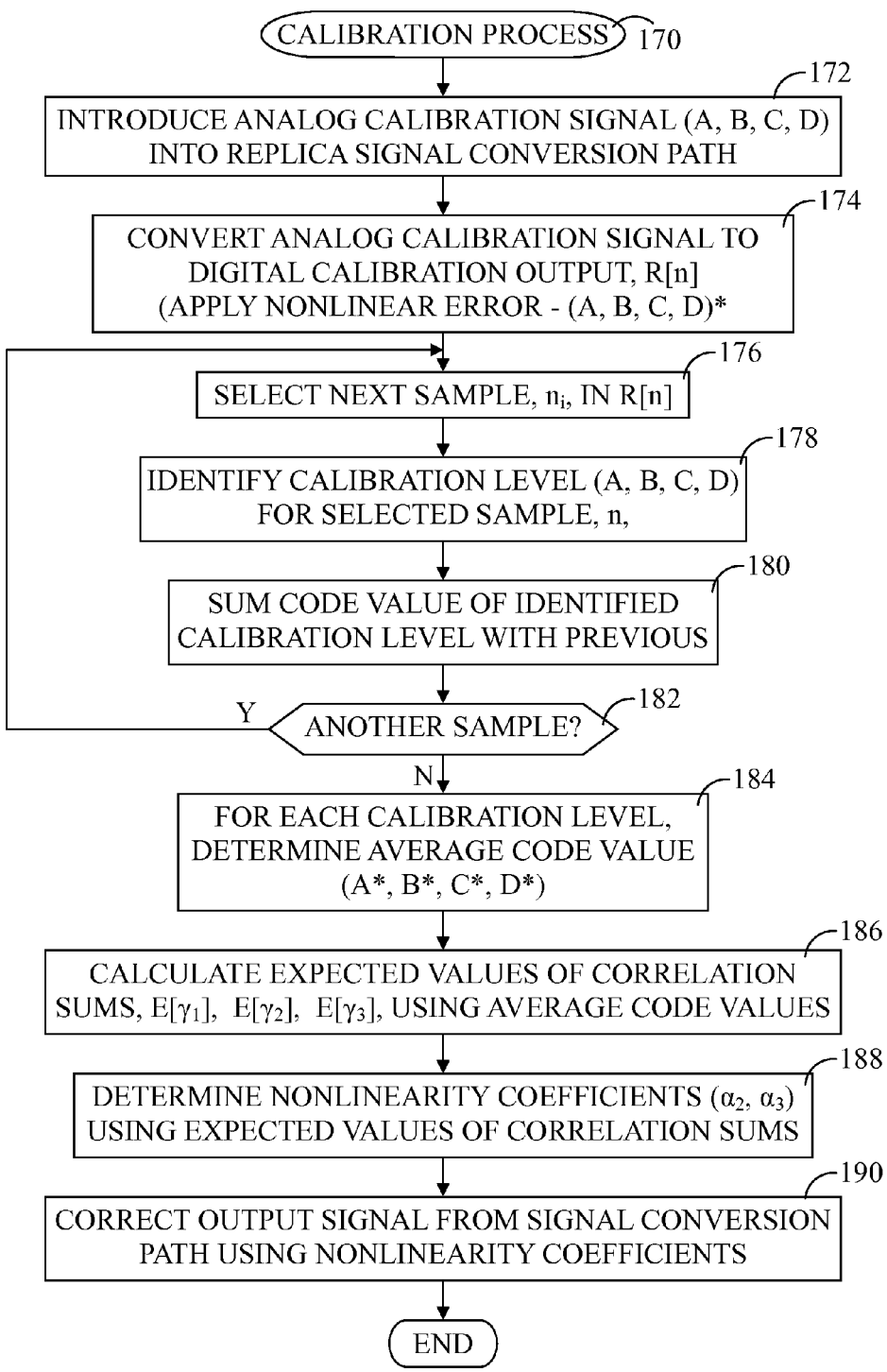

ANALOG-TO-DIGITAL CONVERTER WITH EXPECTED VALUE NONLINEARITY CALIBRATION

TECHNICAL FIELD OF THE INVENTION

The present invention relates generally to analog-to-digital converters (ADCs). More specifically, the present invention relates to timely estimation and correction of signal path nonlinear error in an analog-to-digital converter (ADC).

BACKGROUND OF THE INVENTION

Delta-sigma modulator analog-to digital-converters (ADCs) are used almost exclusively in a number of applications such as communications systems, consumer and professional audio, industrial weight scales, and precision measurement devices. Such delta-sigma modulator ADCs can provide both relatively low cost conversion and flexibility in converting low bandwidth input signals.

Typical conventional analog delta-sigma modulators present significant design challenges when implemented in highly-scaled CMOS IC technology optimized for digital circuitry. Such conventional delta-sigma modulators require analog comparators, high-accuracy analog integrators, high-linearity feedback digital-to-analog converters (DACs), and low-noise, low-impedance reference voltage sources. Continuous-time delta-sigma modulators with continuous-time feedback DACs additionally require low jitter clock sources. These circuit blocks are difficult to design as CMOS technology is scaled below the 90 nm node because the scaling tends to worsen supply voltage limitations, device leakage, device nonlinearity, signal isolation, and 1/f noise.

An alternate type of delta-sigma modulator avoids the analog blocks and includes a voltage-controlled ring oscillator (ring VCO) with its inverters sampled at the desired output sample-rate followed by digital circuitry. The ring VCO delta-sigma modulator structure has the same functionality as a first-order continuous-time delta sigma modulator. However, the ring VCO inevitably introduces severe nonlinearity. The dominant, frequency-independent component of this nonlinearity is referred to herein as nonlinear error.

Prior art embodiments of ring VCO delta-sigma modulators have pioneered the establishment of high-performance ADC's within digitally optimized CMOS processes. A technique for correcting the nonlinear error of a ring VCO based ADC entails injecting a zero mean pseudorandom input sequence into a replica conversion path. The output of this path is then correlated according to various combinations of the original input sequence. Over a relatively long period of time, these correlation sums will converge in order to obtain estimated coefficients. These estimated coefficients can then be used to correct the nonlinear error of the signal path and improve the signal to noise-plus-distortion ratio (SNDR) at the ADC output. Unfortunately, this prior art technique requires lengthy digital background calibration to accurately estimate the coefficients to correct gain nonlinearities. Thus, continuous improvements in calculation efficiencies are needed in order to achieve increased calibration speeds and reduced power consumption.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 8 shows a flowchart of a calibration process implemented within the ADC system of FIG. 1.

DETAILED DESCRIPTION

In overview, embodiments of the present invention entail an analog-to-digital converter (ADC) system and a method for correcting nonlinear error introduced by an ADC within the system. More particularly, the ADC system entails a mostly digital voltage-controlled ring oscillator (VCO) continuous-time delta-sigma modulator for analog-to-digital conversion and a calibration unit. The calibration unit estimates and provides correction data to the delta-sigma modulator ADC to correct frequency independent nonlinear error introduced by the VCO of the delta-sigma signal modulator ADC. Methodology implemented by the calibration unit calculates expected values of correlation sums in lieu of waiting for the calibration sums to converge sufficiently. Furthermore, an analog calibration sequence may be optimized by using a stepwise, or stepped, input.

The calibration methodology described herein can improve the accuracy of correction coefficient estimation and decrease the amount of time required to estimate the coefficients, thereby allowing for lower power operation, as components do not need to be used as long to attain sufficiently accurate correction coefficient estimates. Accordingly, the calibration methodology provides a more efficient technique for drastically improving the speed of calibrating out nonlinear error in a system. A ring VCO delta-sigma modulator ADC is used as an exemplary system in order to demonstrate and describe this calibration methodology. In such a ring VCO ADC, it can be assumed that the nonlinear error can be modeled by a third order polynomial. However, it should be understood that the present invention may be adapted for use in connection with an arbitrary nonlinear system and for estimating/correcting higher order nonlinearities.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

Figure 1:
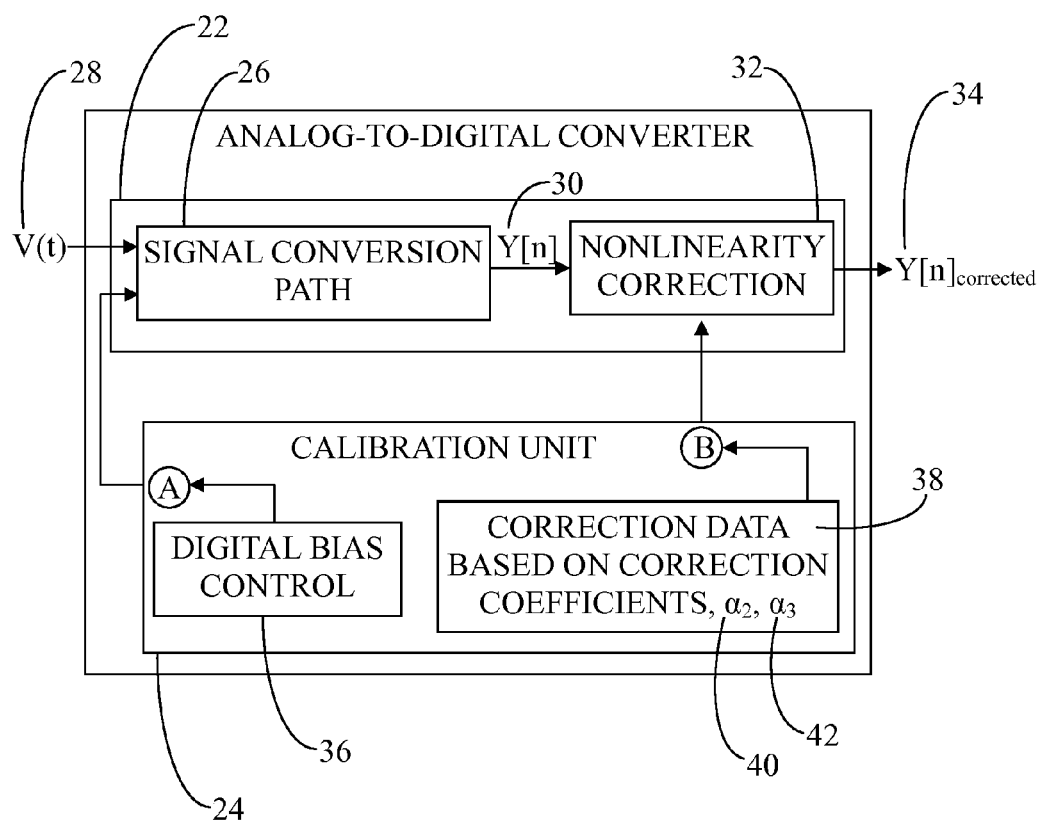
FIG. 1 shows a generalized block diagram of an analog-to-digital converter (ADC) system in accordance with an embodiment.

Referring to FIG. 1, FIG. 1 shows a generalized block diagram of an analog-to-digital converter (ADC) system 20 in accordance with an embodiment. System 20 generally includes an ADC 22 and a calibration unit 24 in communication with ADC 22. ADC 22 generally has an actual signal conversion path 26 for converting an analog input signal 28, labeled V(t), to a digital signal output 30, labeled Y[n]. As will be discussed below, nonlinear error may be introduced to analog input signal 28 as it is converted to digital signal output 30. Accordingly, ADC 22 further includes a nonlinearity correction block 32 for correcting the nonlinear error in digital signal output 30 to produce a corrected digital signal output 34, labeled Y[n]$_{corrected}$. Calibration unit 24 generally provides digital bias control 36 to ADC 22 and correction data 38 based on correction coefficients, and more particularly, based on a second-order correction coefficient 40, labeled $\alpha_2$ and a third-order correction coefficient 42, labeled $\alpha_3$. A detailed discussion of ADC 22 is presented below in connection with FIG. 2 and a detailed discussion of calibration unit 24 is presented below in connection with FIG. 3.

Figure 2:
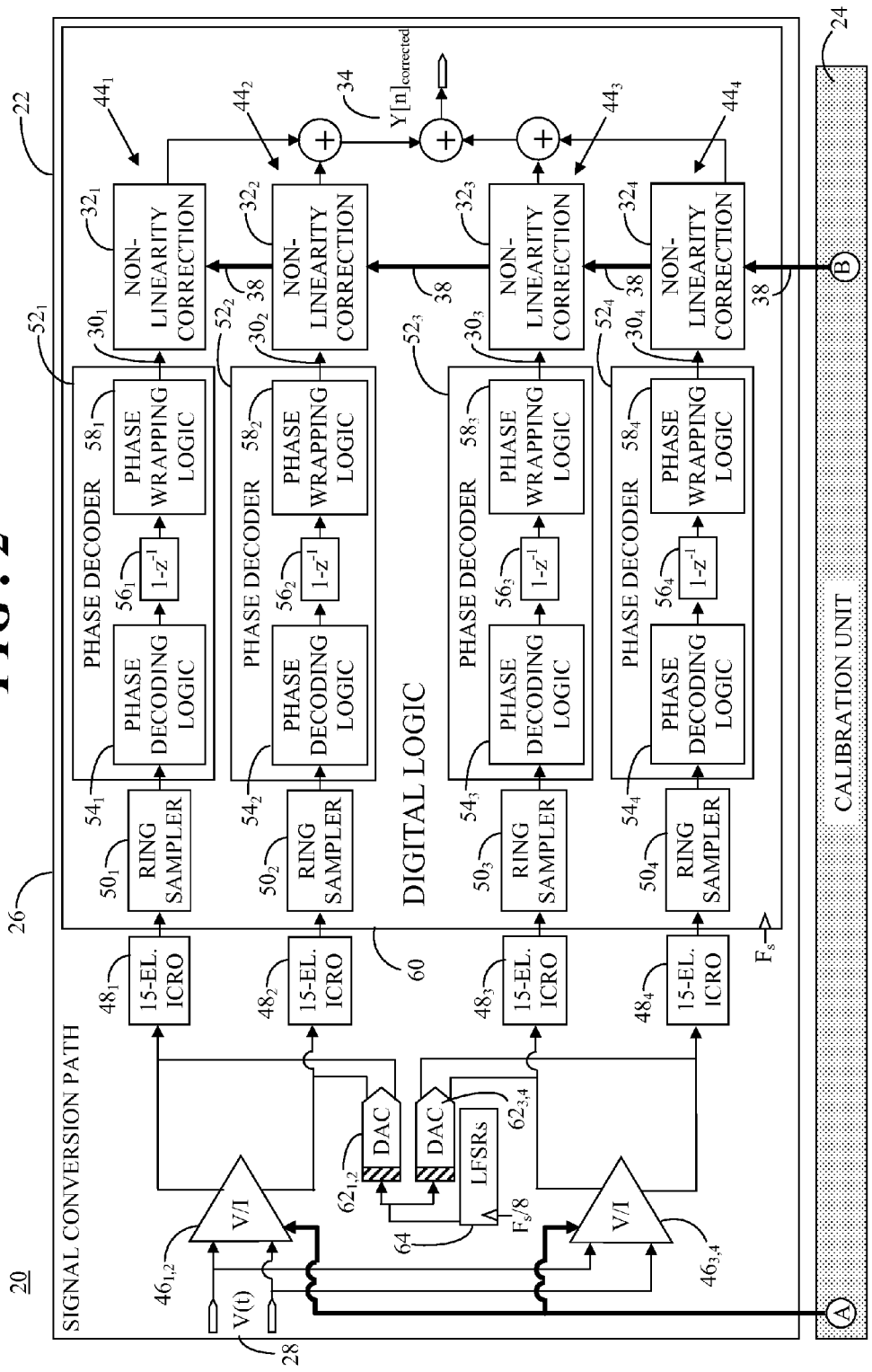
FIG. 2 shows a block diagram of an ADC portion of the system of FIG. 1.

FIG. 2 shows a block diagram of ADC 22 of system 20. Additionally, calibration unit 24 is generally represented in FIG. 2 by a shaded block and may be located on-chip with ADC 22. In an embodiment, ADC 22 is a mostly digital voltage-controlled ring oscillator (VCO) continuous-time delta-sigma modulator for analog-to-digital conversion. That is, ADC 22 functions to convert analog input signal 28 to digital signal output 30 and digital signal output 30 is corrected at nonlinearity correction block 32 to produce corrected digital signal output 34.

In an exemplary configuration, actual signal conversion path 26 for ADC 22 generally includes four signal conversion sub-paths $44_1$, $44_2$, $44_3$, $44_4$, where one pair of signal conversion sub-paths ($44_1$, $44_2$) forms a single pseudo-differential signal path and the other pair of signal conversion sub-paths ($44_3$, $44_2$) forms another single pseudo-differential signal path. Thus, ADC 22 includes two pseudo-differential signal paths, and the overall corrected digital signal output 34 of ADC 22 is the sum of the two pseudo-differential signal path outputs, with the first pseudo-differential signal path having subscript 1 and subscript 2 monikers and the second pseudo-differential signal path having subscript 3 and subscript 4 monikers. Correspondingly, the elements of each of sub-paths $44_1$, $44_2$, $44_3$, $44_4$ in FIG. 2 is identified by their particular moniker, e.g., 1, 2, 3, 4, to differentiate the elements in each signal conversion sub-path $44_1$, $44_2$, $44_3$, $44_4$. The terms "first," "second," "third," and so forth used herein do not refer to an ordering or prioritization of elements within a countable series of elements. Rather, the terms "first," "second," "third," and so forth are used to distinguish certain elements, or groups of elements, from one another for clarity of discussion.

In the illustrated embodiment, a VCO is implemented as a voltage-to-current (V/I) converter 46 followed by a 15-element current-controlled ring oscillator (ICRO) 48, where two signal sub-paths share the fully-differential V/I converter 46. More particularly, signal sub-paths $44_1$ and $44_2$ share V/I converter $46_{1,2}$, and signal sub-paths $44_3$ and $44_4$ share V/I converter $46_{3,4}$. Thus, each signal sub-path $44_n$ includes ICRO $48_n$, a ring sampler $50_n$, a phase decoder $52_n$, and non-linearity correction block $32_n$, where "n" is that sub-path moniker. In some embodiments, phase decoder $52_n$ may include phase decoding logic $54_n$, a digital differentiator $56_n$, and phase wrapping logic $58_n$. As shown herein, ring sampler $50_n$, the functions of phase decoder $52_n$, and non-linearity correction block $32_n$ may be implemented in digital logic 60.

In general, ring sampler $50_n$ has a corresponding number of flip flops to ICRO $48_n$ and the flip flops are clocked at a sampling rate, $f_s$, where the D input of each flip-flop is driven by the output of one of the VCO's inverters. Phase decoder $52_n$ maps a corresponding number of values into a phase number which is differentiated by digital differentiator $56_n$ with a transfer function of $1-z^{-1}$. Correction to digital signal output $30_n$, Y[n], is applied via non-linearity correction block $32_n$ based upon calibration unit 24 to produce corrected digital signal output 34, Y[n]$_{corrected}$. Calibration unit 24 operates in background and periodically updates its output correction data 38 with new measurement results.

In the illustrated embodiment, a pair of 4-level digital-to-analog converters (DACs) $62_{1,2}$ and $62_{3,4}$ add a pseudo-random dither sequence generated by a dither generator 64 to signal conversion sub-paths $44_1$ and $44_3$. Correspondingly, DACs $62_{1,2}$ and $62_{3,4}$ subtract the pseudo-random dither sequence generated by dither generator 64 from signal conversion sub-paths $44_2$ and $44_4$. Dither generator 64 provides each dither DAC 62 with a 4-level white pseudorandom sequence with a sample-rate of $f_s/8$. Each dither DAC $62_{1,2}$ and $62_{3,4}$ converts this sequence into a differential current signal with a peak-to-peak range approximately equal to the quantization step-size referred to the inputs of the ICROs $48_n$.

The dither causes the quantization noise from each pseudo-differential signal path to be free of spurious tones and uncorrelated with the input signal. The dither also degrades the signal-band SNR of each pseudo-differential signal path. However, the dither components that cause the SNR degradation in the output sequences of the two pseudo-differential signal paths have equal magnitudes and opposite polarities, whereas the signal components in the two output sequences are identical, and the noise components in the two output sequences are uncorrelated. Therefore when the two output sequences are added, the unwanted dither components cancel, the signal components add in amplitude, and the noise components add in power.

As is known in the art, current-controlled ring oscillator (ICRO) $48_n$ introduces nonlinear error to analog input signal 28. Provided that analog input signal 28, V(t) does not change significantly over each sample interval, then digital signal output 30, Y[n], can be modeled as follows:

$$Y[n] = \omega[n] + e_{\Delta\Sigma}[n] + \sum_{i=2}^{\infty} \alpha_i (\omega[n])^i \quad (1)$$

The total nonlinearity in equation (1) can be simplified and represented by summation of an infinite degree polynomial:

$$Y[n] = x + \sum_{i=2}^{\infty} \alpha_i (x)^i \quad (2)$$

where $$\alpha_i \cong \left(\frac{1}{2\pi}\right)^{i-1} \quad (3)$$

Where $\alpha$ at i=2, 3, . . . represents the nonlinear error coefficients. Assuming that higher order nonlinear error coefficients are negligible, the nonlinearity may be modeled as a third degree polynomial, as follows:

$$\alpha_3 x^3 + \alpha_2 x^2 + x = Y[n] \quad (4)$$

A primary goal of calibration unit 24, executing a nonlinearity correction algorithm, is to estimate second-order correction coefficient 40, $\alpha_2$, and third-order correction coefficient 42, $\alpha_3$, so they can be used to correct nonlinear error applied to analog input signal 28 primarily by ICRO $48_n$.

Figure 3:
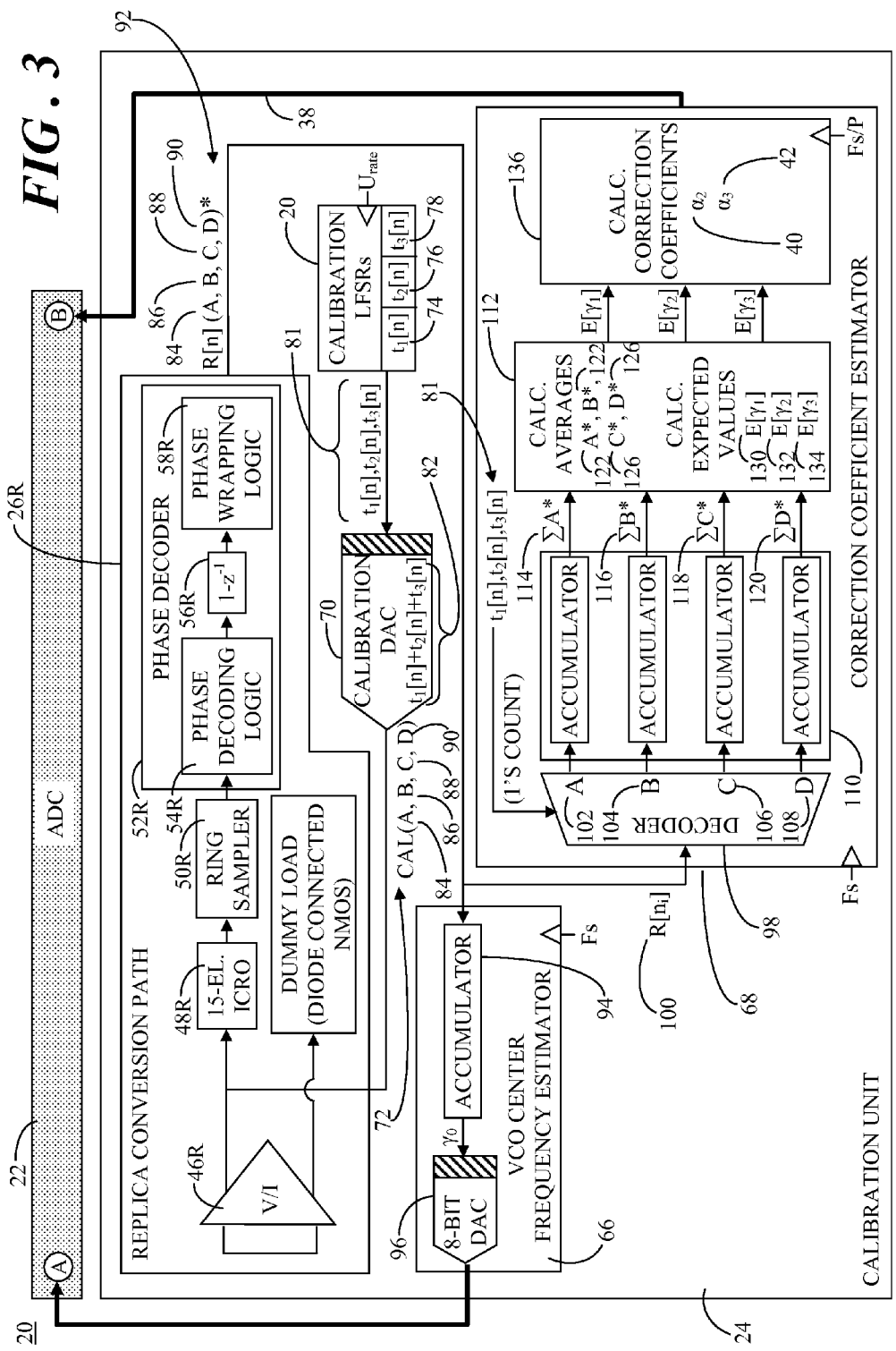
FIG. 3 shows a block diagram of a calibration unit of the system of FIG. 1.

FIG. 3 shows a block diagram of calibration unit 24 of system 20. Additionally, ADC 22 is generally represented in FIG. 3 by a shaded block. In general, calibration unit 24 measures the VCO center frequency and nonlinear distortion of a replica conversion path 26R, and generates digital correction data used by V/I converters $46_{1,2}$ and $46_{3,4}$ and nonlinearity correction blocks $32_{1-4}$ in actual signal conversion path 26 (see FIG. 2) to properly tune the VCO's center frequency and cancel nonlinear error. As such, calibration unit 24 generally includes replica conversion path 26R, a VCO center frequency estimator block 66, and a correction coefficient estimator block 68. Replica path 26R is labeled with reference numerals used in actual signal path 26 plus the additional moniker "R" denoting "replica." Calibration unit 24 operates in background and periodically updates its output correction data 38 with new measurement results.

Replica conversion path 26R for calibration unit 24 is identical to actual signal path 26 including a VCO implementation of V/I converter 46R and ICRO 48R as well as digital logic that includes ring sampler 50R and phase decoder 52R having phase decoding logic 54R, digital differentiator 56R, and phase wrapping logic 58R. However, replica conversion path 26R does not have a nonlinearity correction block 32 (FIG. 2). Additionally, the differential input of V/I converter 46R is zero (i.e., it has a constant, midscale input signal).

A four-level current steering calibration DAC (sampling rate of, for example, $F_s/64$) 70 adds an analog calibration signal 72 to the input of its ICRO 48R. Analog calibration signal 72 is formed from multiple two-level, zero-mean, uncorrelated digital sequences, and more particularly, three two-level, zero-mean, uncorrelated digital sequences. These digital sequences include a first digital sequence 74, labeled $t_1[n]$, a second digital sequence 76, labeled $t_2[n]$, and a third digital sequence 78, labeled $t_3[n]$, each of which may be stored in a calibration sequence shift register 80 where an update rate, $U_{rate}$, of digital sequences 74, 76, 78 is a function of the sampling frequency, $F_s$.

In general, successive input samples of digital sequences 74, 76, 78 are received at calibration DAC 70. Input samples at each successive instance, $n_i$, from each of first, second, and third digital sequences 74, 76, 78 are combined thereby producing successive digital calibration values. An input sample of digital sequences 74, 76, 78 at a given instance, $n_i$, that is input into calibration DAC 70 is represented by an input sample 81, labeled $t_1[n], t_2[n], t_3[n]$ in FIG. 3. Similarly, an input combination of the three digital sequences 74, 76, 78 at a given instance, $n_i$, is represented by a digital calibration value 82, labeled $t_1[n]+t_2[n]+t_3[n]$, in calibration DAC 70 of FIG. 3. Successive digital calibration values 82 are converted at calibration DAC 70 to produce analog calibration signal 72.

As mentioned above, each digital sequence 74, 76, 78 is "two-level," meaning that at each instance, $n_i$, first digital sequence 74 will be a "0" or "1," second digital sequence 76 will be a "0" or "1," and third digital sequence 78 will be a "0" or "1." The three two-level digital sequences 74, 76, 78 produce eight possible input combinations. These input combinations include [000], [001], [010], [011], [100], [101], [110], and [111]. Following digital-to-analog conversion at calibration DAC 70, these input combinations yield a total of four possible calibration levels within analog calibration signal 72. For simplicity, the calibration levels are referred to herein as a first calibration level 84, labeled "A," a second calibration level 86, labeled "B," a third calibration level 88, labeled "C," and a fourth calibration level 90, labeled "D." Thus, the nomenclature utilized for analog calibration signal 72 in FIG. 3 is CAL(A, B, C, D) to indicate that analog calibration signal 72 includes four calibration levels 84, 86, 88, 90.

Analog calibration signal 72, that includes the four calibration levels 84, 86, 88, 90, undergoes analog-to-digital conversion via replica conversion path 26R to produce a digital calibration output 92 that includes the four calibration levels 84, 86, 88, 90. Analog calibration signal 72 is introduced to a source of nonlinear error in ADC system 20. This source of nonlinear error is replica conversion path 26R, and more particularly ICRO 48R. Of course, since replica conversion path 26R is identical to actual signal conversion path 26 of ADC 22, this same source of nonlinear error (e.g., ICRO $48_{1-4}$ of FIG. 2) is also present in actual signal conversion path 26. Following conversion of analog calibration signal 72, digital calibration output 92 will have this nonlinear error. Thus, the nomenclature utilized for digital calibration output 92 in FIG. 3 is R[n](A, B, C, D)* to indicate that digital calibration output 92 includes the four calibration levels 84, 86, 88, 90 to which nonlinear error (*) has been applied.

Per convention, for VCO center frequency calibration performed by VCO center frequency estimator 66, an accumulator 94 adds each successive set of output samples from digital calibration output 92 and scales the result by a constant, K, to produce a digital sequence, as follows:

$$\Delta I[m] = K \sum_{i=0}^{P-1} R[n] \quad (5)$$

where $P=2^{28}$ and R[n] is digital calibration output 92. The eight most significant bits of this sequence may be converted to an analog signal via an 8-bit DAC 96 of VCO center frequency estimator 66, and this analog signal can be used to adjust V/I converters $46_{1,2}$ and $46_{3,4}$ (FIG. 2) in actual signal conversion path 26. To the extent that actual signal conversion path 26 and replica conversion path 26R match, this causes the VCO implementation of V/I converters $46_{1,2}$ and $46_{3,4}$ and ICROs $48_{1-4}$ to have a frequency very close to the sampling frequency, $F_s$, when analog input signal 28 (FIG. 2), V(t) is zero.

In some embodiments, nonlinearity correction block $32_{1-4}$ (FIG. 2) in actual signal conversion path 26 may be a high-speed look-up table with mapping data updated periodically by correction coefficient estimator block 68 of calibration unit 24. By way of example, the look-up table maps each 5-bit input sample, e.g., digital output sample 30, Y[n] (FIG. 2), into an output sample, e.g., corrected digital signal output 34, $Y[n]_{corrected}$ (FIG. 2) such that $$Y[n]_{corrected} = Y[n] - \tilde{\alpha}_2 (Y[n])^2 - (\tilde{\alpha}_3 - 2\tilde{\alpha}_2^2)(Y[n] - \tilde{\alpha}_2 (Y[n])^2)^3 \quad (6)$$

where $\tilde{\alpha}_2$ and $\tilde{\alpha}_3$ are measurements of correction coefficients 40 and 42, $\alpha_2$ and $\alpha_3$ in equation (4). If $\tilde{\alpha}_i = \alpha_i$ for i=2 and i=3, then Y[n]$_{corrected}$ does not contain any VCO-induced second-order or third-order distortion.

In accordance with a particular embodiment, the purpose of correction coefficient estimator block 68 is to estimate correction coefficients 40, 42 accurately and time efficiently using expected values of correlation sums and correcting nonlinear error in digital signal output 34 (FIG. 2), Y[n] based upon these correction coefficients 40, 42 to produce corrected digital signal output, Y[n]$_{corrected}$.

Thus, correction coefficient estimator block 68 includes a decoder 98 configured to receive successive digital output samples 100, labeled R[n$_i$], from digital calibration output 92, wherein each successive digital output sample 100 corresponds to one of input samples 81 of digital sequences 74, 76, 78 following analog-to-digital conversion via replica signal path 26R. Decoder 98 compares digital output sample 100 with the corresponding input sample 81 of digital sequences 74, 76, 78 at the same given instance, n$_i$. Decoder 98 sorts each digital output sample 100 into calibration level subsets. In this example, a first calibration level subset 102 corresponds to first calibration level 84, "A," a second calibration level subset 104 corresponds to second calibration level 86, "B," a third calibration level subset 106 corresponds to third calibration level 88, "C," and a fourth calibration level subset 108 corresponds to fourth calibration level 90, "D."

Each input sample 81 has an initial code value corresponding with its input combination of 1's and 0's. For simplicity, an input combination [000] has an initial code value of "A," each input combination [001], [010], [100] has an initial code value of "B," each input combination of [011], [110], [101] has an initial code value of "C," and an input combination of [111] has an initial code value of "D," where A, B, C, D are come predefined input values or magnitudes. Due to the applied nonlinear error, the actual code values of "A," "B," "C," and "D" of digital output samples 100 may differ from input samples 81. However, decoder 98 can identify which calibration level 84, 86, 88, 90 each digital output sample 100 is intended to be by knowing the input sample 81 of digital sequences 74, 76, 78 at a given instance, n$_i$. Accordingly, each digital output sample 100 is sorted into calibration level subsets 102, 104, 106, 108 using knowledge of the associated input combination for each input sample 81.

An accumulator 110 is in communication with decoder 98. For each of calibration level subsets 102, 104, 106, 108, accumulator 110 sums the code values of each digital output sample 100 within the calibration level subset 102, 104, 106, 108 and outputs summed code values that are utilized by an expected value calculator 112. In this example, a first summed code value 114, labeled ΣA*, represents the total code value at first calibration level subset 102 corresponding to first calibration level 84, "A," and having nonlinear error (*) applied thereto. Similarly, a second summed code value 116, labeled ΣB*, represents the total code value at second calibration level subset 104 corresponding to second calibration level 86, "B," and having nonlinear error (*) applied thereto. A third summed code value 118, labeled ΣC*, represents the total code value at third calibration level subset 106 corresponding to third calibration level 88, "C," and having nonlinear error (*) applied thereto. A fourth summed code value 120, labeled ΣD*, represents the total code value at fourth calibration level subset 108 corresponding to fourth calibration level 90, "D," and having nonlinear error (*) applied thereto.

Expected value calculator 112 determines an average code value for each of first, second, third, and fourth summed code values 114, 116, 118, and 120. A first average code value 122, A*, corresponds to first calibration level 84, "A," and having nonlinear error (*) applied thereto. Likewise, a second average code value 124, B*, corresponds to second calibration level 86, "B," and having nonlinear error (*) applied thereto. A third average code value 126, C*, corresponds to third calibration level 88, "C," and having nonlinear error (*) applied thereto. A fourth average code value 128, D*, corresponds to fourth calibration level 90, "D," and having nonlinear error (*) applied thereto.

Expected value calculator 112 can then utilize average code values 122, 124, 126, 128 to calculate expected values of correlation sums. Expected values of the correlation sums are represented in FIG. 3 by a first expected value 130, labeled E[γ$_1$], a second expected value 132, labeled E[γ$_2$], and third expected value 134, labeled E[γ$_3$]. The current state of the art calibration technique is to correlate digital calibration output 92 of replica conversion path 26R against three 2-level sequences: t$_1$[n], t$_1$[n]xt$_2$[n], and t$_1$[n]xt$_2$[n]xt$_3$[n] to obtain the three F$_s$/2$^{28}$-rate sequences. The correlation sums are represented by the following:

$$\gamma_1[m] = \frac{1}{P}\sum_{i=0}^{P-1} r[mP+i]t_1[mP+i] \quad (7)$$

$$\gamma_2[m] = \frac{1}{P}\sum_{i=0}^{P-1} r[mP+i]t_1[mP+i]t_2[mP+i] \quad (8)$$

$$\gamma_3[m] = \frac{1}{P}\sum_{i=0}^{P-1} r[mP+i]t_1[mP+i]t_2[mP+i]t_3[mP+i] \quad (9)$$

where P=2$^{28}$. It is further known that when the sampling frequency is F$_s$ for the VCO (ICRO 48R) of replica conversion path 26R, then the following is true:

$$\frac{\gamma_2}{2\gamma_1^2} \approx \alpha_2 \quad (10)$$

$$\frac{\gamma_3}{6\gamma_1^3} \approx \alpha_3 \quad (11)$$

It can be shown that the correlation sums converge to their expected value. Let: X$_o$, X$_1$, X$_2$, ... X$_{P-1}$ be a quantity "P" independent identically distributed (IID) random variables (RVs). Each X$_i$ has mean E$_X$[X] and variance var(X). It can be shown that:

$$r[0] \times t_1[0], r[1] \times t_1[1], r[2] \times t_1[2], \ldots, r[P-1] \times t_1[P-1]$$

Can be treated the same as X$_o$, X$_1$, X$_2$, ... X$_{P-1}$; P IID RVs $$r[0] \times t_1[0]t_2[0]t_3[0], r[1] \times t_1[1]t_2[1]t_3[1],$$

-continued $$r[2] \times t_1[2]t_2[2]t_3[2], \ldots, r[P-1] \times t_1[P-1]t_2[P-1]t_3[P-1]$$

Can be treated the same as: $X_o, X_1, X_2, \ldots X_{P-1}$; P IID RVs
Now let $\overline{X}$ be the sample mean:

$$\overline{X} = \left(\frac{1}{P}\right)\sum_{i=0}^{P-1} X_i \quad (12)$$

Simplifying:

$$E_{\overline{X}}[\overline{X}] = E_{\overline{X}}\left[\left(\frac{1}{P}\right)\sum_{i=0}^{P-1} X_i\right] = \frac{1}{P}E_{\overline{X}}\left[\left(\frac{1}{P}\right)\sum_{i=0}^{P-1} X_i\right] \quad (13)$$

Simplifying:

$$E_{\overline{X}}[\overline{X}] = \left(\frac{1}{P}\right)\sum_{i=0}^{P-1} E_{X_i}[X_i] = \frac{1}{P} P \times E_X[X] \quad (14)$$

Simplifying:

$$E_{\overline{X}}[\overline{X}] = E_X[X] \quad (15)$$

Since all $X_i$'s are IID, they are uncorrelated. Therefore, the variance of the summed IID RVs is as follows:

$$\text{var}(\overline{X}) = \text{var}\left(\frac{1}{P}\sum_{i=0}^{P-1} X_i\right) = \frac{1}{P^2}\sum_{i=0}^{P-1} \text{var}(X_i) \quad (16)$$

Simplifying:

$$\text{var}(\overline{X}) = \frac{P \times \text{var}(X)}{P^2} = \frac{\text{var}(X)}{P} \quad (17)$$

Therefore as P approaches infinity, i.e., P→∞, the variance of the summed IID RVs approaches zero, i.e., var($\overline{X}$)→0, which means that the sample mean RV, $\overline{X}$, converges to its expected value $E_X[X]$. Therefore, as P becomes very large, the correlation sums demonstrated by equations (7), (8), (9) approach their expected values 130, 132, 134, i.e., $\gamma_1[m]=E[\gamma_1]$, $\gamma_2[m]=E[\gamma_2]$, and $\gamma_3[m]=E[\gamma_3]$.

Thereafter, first, second, and third expected values 130, 132, 134 ($E[\gamma_1]$, $E[\gamma_2]$, $E[\gamma_3]$) of the correlation sums can be used by a correction coefficient calculator 136 of correction coefficient estimator 68 to determine second and third order correction coefficients 40 and 42 by adapting equations (10) and (11), as follows:

$$\frac{E[\gamma_2]}{2E[\gamma_1]^2} \approx \alpha_2 \quad (18)$$

$$\frac{E[\gamma_3]}{6E[\gamma_1]^3} \approx \alpha_3 \quad (19)$$

Consequently, correction coefficient estimator block 68 can calculate the values for the look-up table of equation (6) using equations (18) and (19) for second and third order correction coefficients 40, 42 based on first, second, and third expected values 130, 132, 134 of the correlation sums. These values, as correction data 38, can then be loaded into nonlinearity correction blocks $32_{1-4}$ (FIG. 2) of signal conversion path 26 (FIG. 2).

Figure 4:
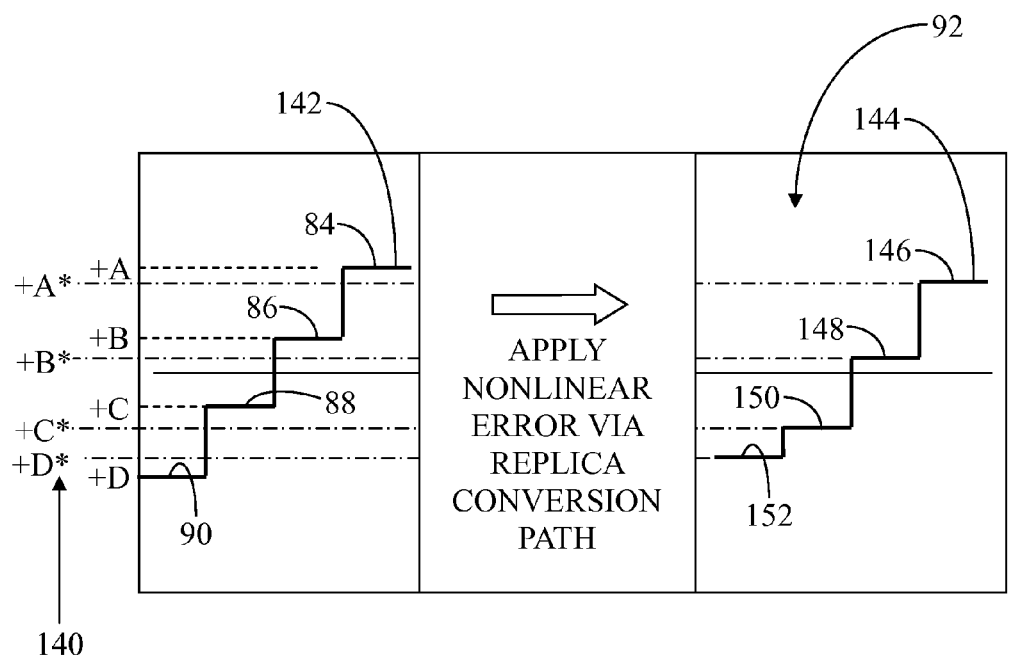
FIG. 4 shows an exemplary graph of nonlinear error applied to an analog calibration signal as it is converted to a digital calibration output via a replica conversion path of calibration unit of FIG. 3.

FIG. 4 shows an exemplary graph 138 of nonlinear error 140 applied to analog calibration signal 72 (FIG. 3) as it is converted to digital calibration output 92 via replica conversion path 26R of calibration unit 24 (FIG. 3). More particularly, graph 138 illustrates a DAC output transfer curve 142 of calibration levels 84, 86, 88, 90 (labeled +A, +B, +C, +D) under ideal conditions as compared to a replica conversion path transfer curve 144 of calibration levels 84, 86, 88, 90 to which nonlinear error 140 has been applied (labeled +A*, +B*, +C*, +D*). More particularly, the magnitude of calibration levels 84, 86, 88, 90 in the form of code values 146, 148, 150, 152 has shifted relative to (i.e., differs from) the actual calibration levels 84, 86, 88, 90 as is demonstrated by replica path transfer curve 144. This shift, i.e., nonlinear error 140, is due primarily to current-controlled ring oscillator (ICRO) 48R (FIG. 3) in replica conversion path 26R and is generally frequency independent.

Nonlinear error 140 is also present in actual signal conversion path 26 (FIG. 2) due primarily to ICRO's $48_{1-4}$ (FIG. 2) in signal conversion path 26. Accordingly, by calculating first, second, and third expected values 130, 132, and 134 of the correlation sums, determining correction coefficients 40, 42 using expected values 130, 132, 134, and calculating correction data 38 based on correction coefficients 40, 42 to be loaded into nonlinearity correction blocks $32_{1-4}$ (FIG. 2) of signal conversion path 26, nonlinear error 140 can largely be canceled from digital signal output 30 (FIG. 2) of actual signal conversion path 26 to produce corrected digital signal output 34 (FIG. 2).

Figure 5:
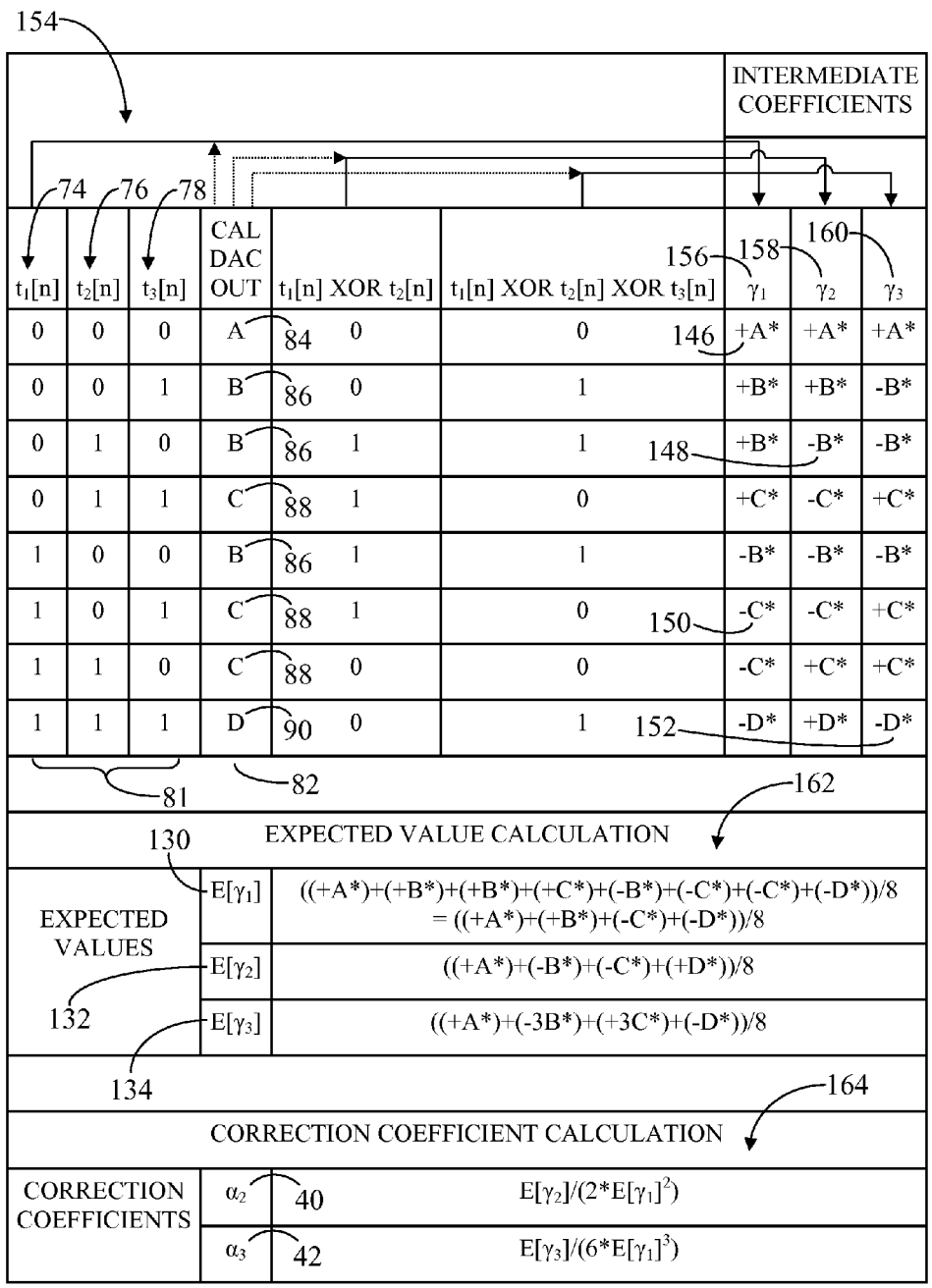
FIG. 5 shows a diagram of a truth table and related equations for determining correction coefficients in accordance with an embodiment.

Referring to FIGS. 3 and 5, FIG. 5 shows a diagram of a truth table 154 and related equations for determining correction coefficients 40, 42 in accordance with an embodiment. Truth table 154 is provided herein to further illustrate that by knowing all possible input combinations of input samples 81 used to produce digital calibration values 82 for conversion to analog calibration signal 72, the first, second, and third expected values 130, 132, 134 can be readily calculated without having to wait for P (i.e., the number of samples) to be sufficiently large.

Truth table 154 illustrates the eight possible combinations of input samples 81 from first, second, and third digital sequences 74, 76, 78 that yield digital calibration values 82. Again, in this example, each input sample 81 has an initial code value corresponding with its input combination of 1's and 0's. A calibration DAC output column of table 154 provides digital calibration values 82 (i.e., code values) for each combination of input samples. For simplicity, an input combination [000] has an initial code value, i.e., calibration level 84, of "A." Input combinations [001], [010], [100] have an initial code value, i.e., calibration level 86, of "B." Input combinations of [011], [110], [101] have an initial code value, i.e., calibration level 88, of "C." And, an input combination of [111] has an initial code value, i.e., calibration level 90 of "D."

These calibration levels 84, 86, 88, 90 are output from calibration DAC 70 (FIG. 3) within analog calibration signal 72.

Knowing the input combination for successive input samples 81, and the associated one of calibration levels 84, 86, 88, 90, intermediate coefficients 156, 158, 160 (labeled $\gamma_1$, $\gamma_2$, $\gamma_3$ in FIG. 5) can be readily determined. Intermediate coefficients 156, 158, 160 correspond on a per sample basis to the coefficients, $\gamma_1$, $\gamma_2$, $\gamma_3$, of equations (7), (8), (9). In accordance with an embodiment, a value of "0" of one of the three 2-level sequences: $t_1[n]$, $t_1[n]$ XOR $t_2[n]$, and $t_1[n]$ XOR $t_2[n]$ XOR $t_3[n]$ yields an additive code value 146, 148, 150, 152, as denoted by +A*, +B*, +C*, and +D*. A value of "1" of one of the three 2-level sequences: $t_1[n]$, $t_1[n]$ XOR $t_2[n]$, and $t_1[n]$ XOR $t_2[n]$ XOR $t_3[n]$ yields a subtractive code value 146, 148, 150, 152, as denoted by −A*, −B*, −C*, and −D*. Again, the "*" denotes nonlinear error 140 (FIG. 4) applied to the code values at each of calibration levels 84, 86, 88, 90.

For illustrative purposes, FIG. 5 further provides expected value calculations 162 and correction coefficient calculations 164. As discussed above, the correlation sums demonstrated by equations (7), (8), (9) approaches their expected values 130, 132, 134, i.e., $\gamma_1[m]=E[\gamma_1]$, $\gamma_2[m]=E[\gamma_2]$, and $\gamma_3[m]=E[\gamma_3]$. Therefore, each of expected values 130, 132, 134 can be determined as an average of its corresponding eight intermediate coefficients 156, 158, 160 in accordance with expected value calculations 162. Once expected values 130, 132, 134 are calculated, second and third order correction coefficients 40 and 42 can be determined in accordance with correction coefficient calculations 164. Correction coefficient calculations 164 correspond to equations (18) and (19) provided above.

Figure 6:
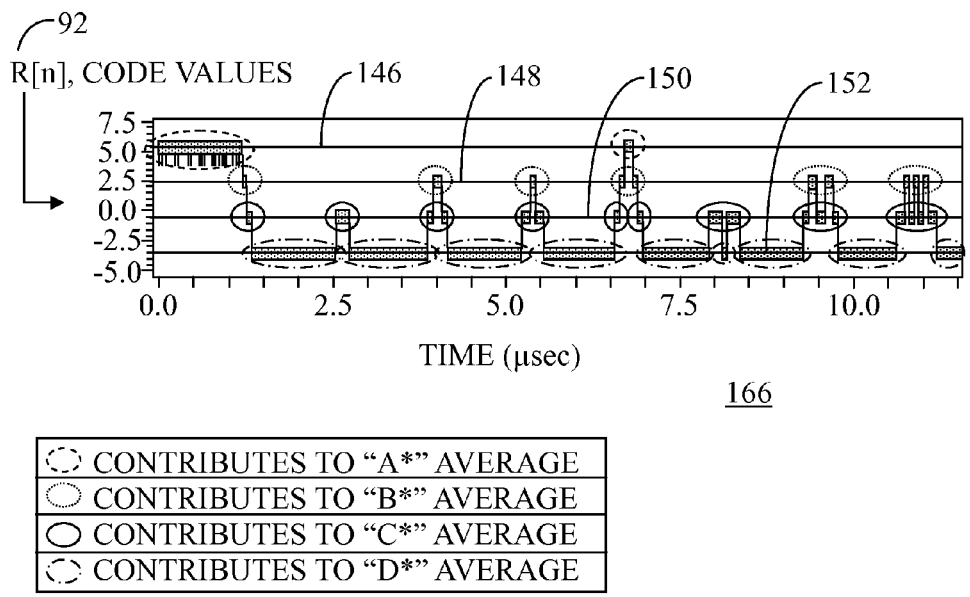
FIG. 6 shows a graph illustrating a digital calibration output of the calibration unit.

FIG. 6 shows a graph 166 illustrating digital calibration output 92 of calibration unit 24 (FIG. 3). In accordance with an embodiment, each of first, second, and third digital sequences 74, 76, 78 (FIG. 3) is a pseudorandom sequence, thus yielding a four-level pseudorandom, zero-mean analog calibration signal 72. As such, digital calibration output 92 is the converted four-level pseudorandom zero-mean sequence. Each digital output sample 100 (FIG. 3) of digital calibration output 92 at each respective level contributes to the average code value 146, 148, 150, 152 having nonlinear error 140 (FIG. 4) applied.

Figure 7:
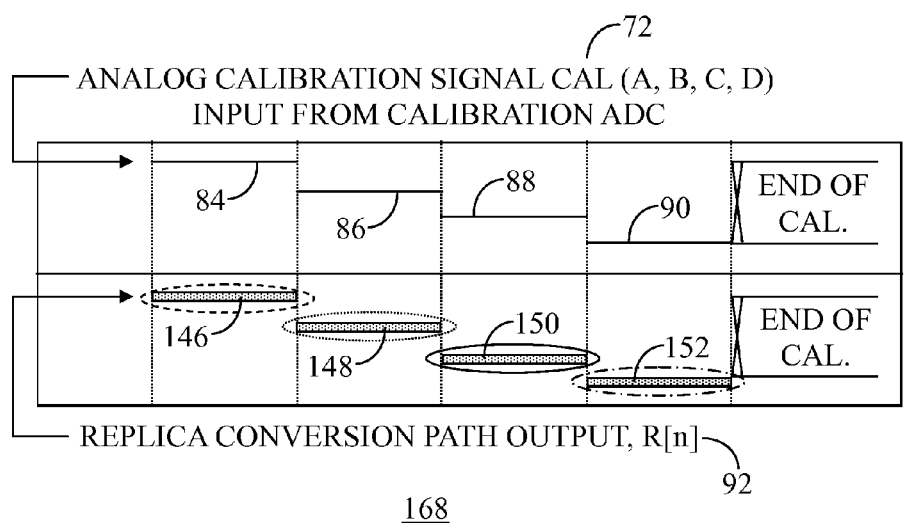
FIG. 7 shows a graph illustrating a digital calibration output of the calibration unit in accordance with another embodiment.

FIG. 7 shows a graph 168 illustrating digital calibration output 92 of calibration unit 24 in accordance with another embodiment. In this alternative embodiment, each of first, second, and third digital sequences 74, 76, 78 (FIG. 3) is a stepped or stepwise sequence, thus yielding a four-level stepwise, zero-mean analog calibration signal 72. As such, digital calibration output 92 is the converted four-level stepwise zero-mean sequence. Each digital output sample 100 of digital calibration output 92 at each respective level contributes to the average code value 146, 148, 150, 152 having nonlinear error 140 (FIG. 4) applied. In this embodiment, calibration entails stepping and dwelling at each of the fourth calibration input levels 84, 86, 88, 90 in order to attain accurate output code value averages 146, 148, 150, 152 in a given period of time. Further optimization of the input calibration sequence by using the stepped analog calibration signal 72 shown in FIG. 7 can enable drastically increased calibration speed.

Referring to FIGS. 3 and 8, FIG. 8 shows a flowchart of a calibration process 170 implemented within ADC system 20 (FIG. 1). Calibration process 170 may be executed by calibration unit 24 as a background process of ADC system 20 (FIG. 1) to determine correction coefficients 40, 42 and periodically update correction data 38 from calibration unit 24 with new measurement results. As the various method steps depicted in FIG. 8 have been described in more detail above in connection with the functional elements of calibration unit 24, calibration process 170 should be considered a summary of the methodology performed within ADC system 20.

The execution of calibration process 170 begins, in a block 172, by introducing an analog calibration signal prior to a source of nonlinear error in an analog-to-digital converter. In this example, analog calibration signal 72 is input into ICRO 48R of replica signal conversion path 26R. In a block 174, analog calibration signal 72 is converted to digital calibration output 92 having nonlinear error 140 (FIG. 4). That is, nonlinear error 140 is applied to analog calibration signal 72 via replica signal conversion path 26R.

In response to the conversion of analog calibration signal 72 to digital calibration output 92 having nonlinear error 140, in a block 176, a next digital output sample, $n_i$, 100 of digital calibration output 92 is selected. Of course, during a first iteration of calibration process 170, a "next" digital output sample 100 will be a first digital output sample 100. In a block 178, one of calibration levels 84, 86, 88, 90 is identified for the selected digital output sample 100. That is, with knowledge of the corresponding input sample 81 of digital sequences 74, 76, 78 at the same given instance, $n_i$, decoder 98 can identify which calibration level 84, 86, 88, 90 corresponds to the selected digital output sample 100. Thereafter, decoder 98 can sort digital output sample 100 to the particular one of first, second, third, and fourth calibration level subsets 102, 104, 106, 108 associated with the identified calibration level 84, 86, 88, 90. In a block 180, accumulator 110 receives digital output sample 100 and sums its particular code value 146, 148, 150, 152 (FIG. 5) with any previous summation at that calibration level 84, 86, 88, 90 distinguished by subsets 102, 104, 106, 108.

Next, in a block 182, a determination is made as to whether there is another digital output sample 100 from digital calibration output 92. When there is another digital output sample 100, process control loops back to block 176 to select the next sample, identify the calibration level for the selected sample in block 178, and sum the code value of the identified calibration level in block 180 with previous code values in a particular one of the calibration level subsets. Blocks 176, 178, and 180 are repeated for each digital output sample 100 from digital calibration output 92.

Accordingly, accumulator 110 can generate first summed code value 114, second summed code value 116, third summed code value 118, and fourth summed code value 120, all of which can be communicated to expected value calculator 112 when the determination is made in block 182 that there is not another digital sample 100 to be categorized and summed. In a block 184, expected value calculator 112 calculates first, second, third, and fourth average code values 122, 124, 126, 128, respectively, using first summed code value 114, second summed code value 116, third summed code value 118, and fourth summed code value 120. Expected values 130, 132, 134 of correlation sums are calculated in a block 186 using these average code values 122, 124, 126, 128.

Correction coefficient calculator 136 determines, in a block 188, correction coefficients 40, 42 using expected values 130, 132, 134 of correlation sums. Thereafter, correction coefficient estimator 68 can generate correction data 38 (FIG. 1) of equation (6) that correspond to the possible values of digital signal output 30, Y[n], using correction coefficients 40, 42. Correction coefficient estimator 68 loads correction data 38 into nonlinearity correction blocks $32_{1-4}$. Nonlinear error 140 (FIG. 4) in digital signal output 30 from actual signal conversion path 26 of ADC modulator 22 is corrected, in a block 190, based upon correction coefficients 40, 42 using correction data 38 to produce corrected digital output 34 (FIG. 1). Thereafter, an iteration of calibration process 170 ends. However, the calibration process 170 can be executed periodically or continuously to obtain new calibration measurements.

It is to be understood that certain ones of the process blocks depicted in FIG. 8 may be performed in parallel with each other or with performing other processes. In addition, it is to be understood that the particular ordering of the process blocks depicted in FIG. 8 may be modified, while achieving substantially the same result. Accordingly, such modifications are intended to be included within the scope of the inventive subject matter. In addition, although particular system configurations are described in conjunction with FIGS. 1-3, above, embodiments may be implemented in systems having other architectures, as well. These and other variations are intended to be included within the scope of the inventive subject matter.

Thus, various embodiments of a method for correcting nonlinear error introduced by an analog-to-digital converter and a system implementing the method have been described. An embodiment of a method for correcting nonlinear error introduced by an analog-to-digital converter comprises introducing an analog calibration signal prior to a source of the nonlinear error in the analog-to-digital converter, wherein the nonlinear error is applied to the analog calibration signal via the source of the nonlinear error. After conversion of the analog calibration signal to a digital calibration output having the nonlinear error, expected values of correlation sums are calculated in response to the digital calibration output. Correction coefficients are determined using the expected values of correlation sums and the nonlinear error is corrected in a digital signal output from the analog-to-digital converter based upon the correction coefficients to produce a corrected digital signal output.

An embodiment of a system comprises an analog-to-digital converter for converting an analog input signal to a digital signal output and a nonlinearity corrector for correcting nonlinear error in said digital signal output to produce a corrected digital signal output. The system further comprises a source of the nonlinear error associated with the analog-to-digital converter, wherein an analog calibration signal is introduced to the source of the nonlinear error during conversion of the analog calibration signal to a digital calibration output having the nonlinear error. After conversion of the analog calibration signal to the digital calibration output, a calibration circuit calculates expected values of correlation sums in response to the digital calibration output, determines correction coefficients using the expected values of correlation sums, and provides correction data based upon the correction coefficients to the nonlinearity corrector.

In summary, an analog-to-digital converter (ADC) system and a method for correcting nonlinear error introduced by an ADC within the system are described. The ADC system comprises a mostly digital voltage-controlled ring oscillator (VCO) continuous-time delta-sigma modulator for analog-to-digital conversion and a calibration unit. The calibration unit estimates and provides correction data to the delta-sigma modulator ADC to correct nonlinear error introduced by the VCO of the delta-sigma signal modulator ADC. Methodology implemented by the calibration unit calculates expected values of correlation sums in lieu of waiting for the calibration sums to converge sufficiently. Furthermore, an analog calibration sequence may be optimized by using a stepwise, or stepped, input. Such calibration methodology can improve the accuracy of correction coefficient estimation and decrease the amount of time required to estimate the coefficients, thereby allowing for lower power operation, as components do not need to be used as long to attain sufficiently accurate correction coefficient estimates.

While the principles of the inventive subject matter have been described above in connection with specific methods and system, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for correcting nonlinear error introduced by an analog-to-digital converter comprising:
introducing an analog calibration signal prior to a source of said nonlinear error in said analog-to-digital converter, wherein said nonlinear error is applied to said analog calibration signal via said source of said nonlinear error;
after conversion of said analog calibration signal to a digital calibration output having said nonlinear error, calculating expected values of correlation sums in response to said digital calibration output;
determining correction coefficients using said expected values of correlation sums; and
correcting said nonlinear error in a digital signal output from said analog-to-digital converter based upon said correction coefficients to produce a corrected digital signal output.

2. The method of claim 1 further comprising:
receiving multiple two-level digital sequences at a digital-to-analog converter;
combining each successive input sample from each of said multiple two-level digital sequences to produce successive digital calibration values; and
converting, at said digital-to-analog converter, said successive digital calibration values to produce said analog calibration signal.

3. The method of claim 2 wherein each of said multiple two-level digital sequences is an uncorrelated pseudorandom sequence.

4. The method of claim 2 wherein each of said multiple two-level digital sequences is a stepwise sequence.

5. The method of claim 2 wherein said combining combines three two-level digital sequences to form said analog calibration signal.

6. The method of claim 1 wherein said analog calibration signal includes multiple calibration signal levels, said digital calibration output includes a plurality of digital code values, and said calculating comprises:
sorting said digital code values into calibration level subsets, one each of said calibration level subsets corresponding to one each of said multiple calibration signal levels;
for each of said calibration level subsets, determining an average code value of said digital code values in said each calibration level subset, said average code value having said nonlinear error; and utilizing said average code value determined for said each calibration level subset to calculate said expected values of correlation sums.

7. The method of claim 6 wherein:

said method further comprises combining input samples from three two-level digital sequences to form an input combination of three input samples at each instance, $n_i$, for conversion to said analog calibration signal, wherein said input combination of said three input samples is one of eight possible input combinations, said eight possible input combinations representing a total of four of said multiple calibration signal levels; and for each of said digital code values, said sorting comprises identifying one of said four calibration signal levels in response to said input combination of said three input samples.

8. The method of claim 1 wherein said analog-to-digital converter includes an actual signal conversion path, and said introducing comprises utilizing a replica conversion path as said source of said nonlinear error to convert said analog calibration signal to said digital calibration output, said replica conversion path corresponding to said actual signal conversion path, wherein said nonlinear error is applied to said analog calibration signal via said replica signal conversion path to produce said digital calibration output having said nonlinear error.

9. The method of claim 8 further comprising:

driving a ring oscillator with a current derived from an analog input signal;

phase converting an intermediate signal determined from an output of said ring oscillator; and generating said digital signal output from said intermediate signal via said actual signal conversion path, said digital signal path output having said nonlinear error, wherein said correcting is performed following said generating to correct said digital signal output for said nonlinear error to produce said corrected digital signal output.

10. A system comprising:

an analog-to-digital converter for converting an analog input signal to a digital signal output and a nonlinearity corrector for correcting nonlinear error in said digital signal output to produce a corrected digital signal output;

a source of said nonlinear error associated with said analog-to-digital converter, wherein an analog calibration signal is introduced to said source of said nonlinear error during conversion of said analog calibration signal to a digital calibration output having said nonlinear error; and a calibration circuit, wherein after conversion of said analog calibration signal to said digital calibration output, said calibration circuit calculates expected values of correlation sums in response to said digital calibration output, determines correction coefficients using said expected values of correlation sums, and provides correction data based upon said correction coefficients to said nonlinearity corrector.

11. The system of claim 10 wherein said calibration circuit comprises a digital-to-analog converter adapted to receive multiple two-level digital sequences, combine each successive input sample from each of said multiple two-level digital sequences to produce successive digital calibration values, and convert said successive digital calibration values to produce said analog calibration signal.

12. The system of claim 11 wherein each of said multiple two-level digital sequences is a stepwise sequence.

13. The system of claim 10 wherein said analog calibration signal includes multiple calibration signal levels, said digital calibration output includes a plurality of digital code values, and said calibration circuit sorts said digital code values into calibration level subsets, one each of said calibration level subsets corresponding to one each of said multiple calibration signal levels, and determines, for each of said calibration level subsets, an average code value of said digital code values in said each calibration level subset, said average code value having said nonlinear error, and said calibration circuit further utilizes said average code value determined for said each calibration level subset to calculate said expected values of correlation sums.

14. The system of claim 10 wherein said calibration circuit comprises a digital-to-analog converter adapted to combine input samples from three two-level digital sequences to form in input combination of three input samples at each instance, $n_i$, for conversion to said analog calibration signal, wherein said input combination of said three input samples is one of eight possible input combinations, said eight possible input combinations representing a total of four of said multiple calibration signal levels, wherein for each of said digital code values, said calibration circuit identifies one of said four calibration signal levels in response to said input combination of said three input samples to sort said digital code values into said calibration level subsets.

15. The system of claim 10 wherein:

said analog-to-digital converter comprises an actual signal path, said actual signal path including a first converter that drives a first ring voltage controlled oscillator driven by said analog input signal, said actual signal path producing said digital signal output by sampling said first ring voltage controlled oscillator, wherein said first ring voltage controlled oscillator introduces said nonlinear error in said digital signal output; and said source of said nonlinear error comprises a replica signal path, said replica signal path including a second ring voltage controlled oscillator driven by said analog calibration signal, said second ring voltage controlled oscillator being a replica of said first voltage controlled oscillator, and said replica signal path producing said digital calibration output by sampling said second ring voltage controlled oscillator, wherein said second ring voltage controlled oscillator introduces said nonlinear error in said digital calibration output.

16. The system of claim 10 wherein said analog-to-digital converter comprises a continuous-time delta-sigma modulator.

17. A method for correcting nonlinear error introduced by an analog-to-digital converter having an actual signal conversion path, said method comprising:

combining multiple two-level digital sequences to form an analog calibration signal;

introducing said analog calibration signal to a replica conversion path to convert said analog calibration signal to a digital calibration output, said replica conversion path corresponding to said actual signal conversion path, wherein said nonlinear error is applied to said analog calibration signal via said replica signal conversion path to produce said digital calibration output having said nonlinear error;

after conversion of said analog calibration signal to said digital calibration output, calculating expected values of correlation sums in response to said digital calibration output;

determining correction coefficients using said expected values of correlation sums; and correcting said nonlinear error in a digital signal path output from said analog-to-digital converter based upon said correction coefficients.

18. The method of claim 17 wherein each of said multiple two-level digital sequences is a stepwise sequence.

19. The method of claim 17 wherein said analog calibration signal includes multiple calibration signal levels, said digital calibration output includes a plurality of digital code values, and said calculating comprises:

sorting said digital code values into calibration level subsets, one each of said calibration level subsets corresponding to one each of said multiple calibration signal levels;

for each of said calibration level subsets, determining an average code value of said digital code values in said each calibration level subset, said average code value having said nonlinear error; and utilizing said average code value determined for said each calibration level subset to calculate said expected values of correlation sums.

20. The method of claim 19 wherein:

said method further comprises combining input samples from three two-level digital sequences to form an input combination of three input samples at each instance, $n_i$, for conversion to said analog calibration signal, wherein said input combination of said three input samples is one of eight possible input combinations, said eight possible input combinations representing a total of four of said multiple calibration signal levels; and for each of said digital code values, said sorting comprises identifying one of said four calibration signal levels in response to said input combination of said three input samples.

* * * * *